US006252264B1

United States Patent
Bailey et al.

(10) Patent No.: US 6,252,264 B1
(45) Date of Patent: Jun. 26, 2001

(54) INTEGRATED CIRCUIT CHIP WITH FEATURES THAT FACILITATE A MULTI-CHIP MODULE HAVING A NUMBER OF THE CHIPS

(75) Inventors: Roger Ned Bailey; Bradley McCredie, both of Austin; Michael Gerard Nealon, Cedar Park; Hugh Rodney Stigdon, Georgetown, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/364,739

(22) Filed: Jul. 30, 1999

(51) Int. Cl.[7] .................................................. H01L 27/10
(52) U.S. Cl. ........................... 257/203; 257/208; 257/723
(58) Field of Search ................................... 257/723–724, 257/203–208, 685, 691; 438/128, 129

(56) References Cited

U.S. PATENT DOCUMENTS 5,257,166 * 10/1993 Marui et al. .......................... 257/723

5,451,814 * 9/1995 Yoshimizu ............................ 257/685
6,078,514 * 6/2000 Takemae et al. ..................... 257/723

OTHER PUBLICATIONS

*Microprocessor Report*: n13, v9, Oct. 2, 1995 p16 (3, ISSN0899–9341, What's Next For Microprocessing Deisign? Some Variant of Multiprocessor Seems Likely. (Industry Trend Or Event) Copyright 1995, MicroDesign Resocurces Inc.

\* cited by examiner

*Primary Examiner*—Olik Chaudhuri
*Assistant Examiner*—Hoai Pham
(74) *Attorney, Agent, or Firm*—Anthony V.S. England; Mark E. McBurney

(57) ABSTRACT

An integrated circuit chip has a first i/o set associated with a first edge of the chip and a second i/o set associated with a second edge of the chip. The first i/o set has a physical symmetry with respect to the second i/o set, to facilitate a number of the chips being interconnected in a ring to one another on a multi-chip module, with the chips symetrically disposed thereon. The chip has a bus interconnecting the first and second i/o sets for transmitting signals across the chip. The bus has regeneration circuitry for regenerating said signals traversing the chip.

10 Claims, 8 Drawing Sheets

US 6,252,264 B1

INTEGRATED CIRCUIT CHIP WITH FEATURES THAT FACILITATE A MULTI-CHIP MODULE HAVING A NUMBER OF THE CHIPS

CROSS-REFERENCE TO RELATED APPLICATION

This application for patent is related to the following concurrently filed and copending U.S. patent applications:

i) Ser. No. 09/364,738, entitled "Multi-chip Module Having Chips Coupled in a Ring"; and ii) Ser. No. 09/364,697, entitled "Communication Method for Integrated Circuit Chips on a Multi-Chip Module" which are hereby incorporated by reference herein.

TECHNICAL FIELD

The present invention relates in general to integrated circuit chips, and in particular, to chips designed for multi-chip systems, especially to aspects of packaging, layout and inter-chip communication aspects of such chips.

BACKGROUND INFORMATION

Operating speeds of integrated circuits, e.g., "IC chips", are ever increasing. Furthermore, according to another trend, chips with extremely dense circuitry and input and output ("i/o") traffic are being implemented on one chip and are being packaged as high-speed, multi-chip systems. High-speed processor chips are an example of this trend. These developments lead to a need to transmit signals between chips at high speeds.

There is a potential to improve communication and operating speeds by locating chips, and especially their i/o leads, close to one another. However, the layout of these very dense chips and their i/o leads is a very complicated matter, making it difficult to design features in their layout which permit such chips to be packaged close to one another.

As a result, there is a need in the art for improvements in chip and package layout, as well as inter-chip communication methods, in order to address the foregoing needs.

SUMMARY OF THE INVENTION

The present invention addresses at least some of the forgoing needs in an integrated circuit chip with a first i/o set associated with a first edge of the chip and a second i/o set associated with a second edge of the chip. The first i/o set has a physical symmetry with respect to the second i/o set, to facilitate a number of the chips being interconnected to one another on a chip carrier, with the chips symetrically disposed on the carrier.

In a further aspect, the bus, which is disposed on the chip and couples coupling the first and second i/o sets, has a turn, to facilitate straight wiring for interconnecting instances of the chip on the carrier.

In other aspects, the chip has a bus interconnecting the first and second i/o sets for transmitting signals across the chip. The bus has regeneration circuitry for regenerating said signals traversing the chip.

Further, the symmetry of the first i/o set with respect to the second i/o set is a reflection symmetry. The axis of the reflection symmetry is a diagonal between two corners of the chip. The second edge is a side adjacent to the first edge. The adjacent first and second edges have a common endpoint at a corner of the chip. One of the two corners is the common endpoint corner.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
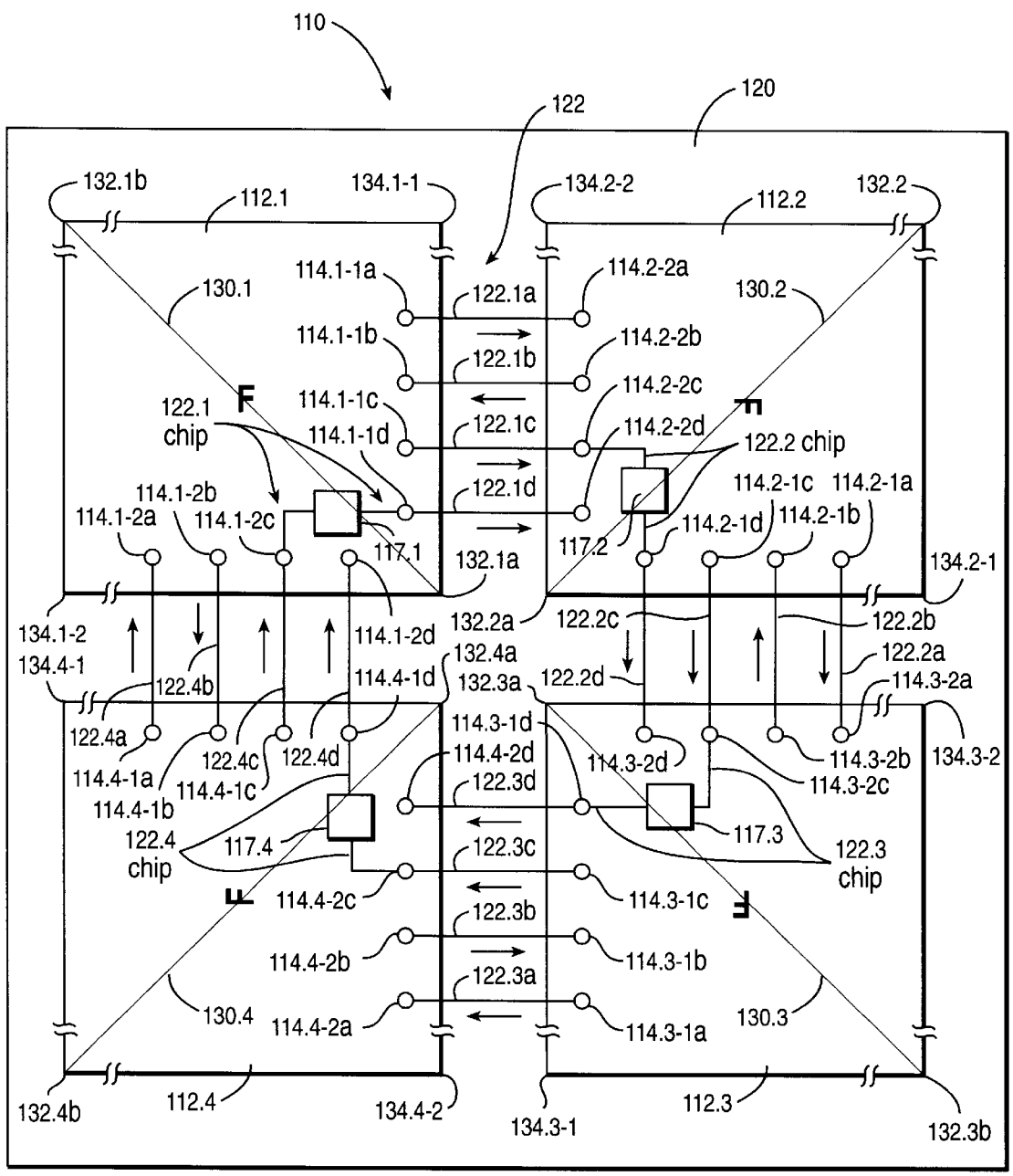
FIG. 1 illustrates an embodiment wherein a multi-chip module has four chips.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Since it is the nature of the invention to have numerous instances of corresponding elements, an element is identified in the drawings and text with a base number having different suffixes for different instances of the element in the drawings. For example, in FIG. 1 multichip module 110 has four, microprocessor chips wired to a dielectric carrier 120. The chips may be referred to collectively as "chips 112", or individually as "chips 112.1, 112.2, 112.3 and 112.4," or "respective chips 112.1, 112.2, 112.3 and 112.4." Chip 112.1 has a first i/o set 114.1-1a, 114.1-1b, 114.1-1c and 114.1-1d, and a second i/o set 114.1-2a, 114.1-2b, 114.1-2c and 114.1-2d, which may be referred to collectively as first set 114.1-1 and second set 114.1-2. Furthermore, since each chip has two such i/o sets, the first sets 114.1-1, 114.2-1, etc. for all the collective chips may be referred to as "i/o set 114-1" and the second sets 114.1-2, 114.2-2, etc. as "i/o set 114-2." It should be understood that although an i/o subset, such as i/o subset 114.1-1a may be represented by a "." such as in FIG. 1, for example; nevertheless, the subset actually includes a number of i/o points, such as for an entire bus having data, address and control lines.

Each of the chips 112 shown in FIG. 1 are microprocessors identical in design, but could be of different designs having i/o sets arranged similarly. Preferrably, the chips are packaged flip-chip style, and accordingly wired with C4 connections to the carrier 120, but the invention is not limited to this configuration.

In the figure, the orientation of each chip is indicated by the "F" symbol on each chip 112.1 through 112.4. The chips are electrically coupled in a communications ring 122. The communications ring 122 has carrier portions disposed on the carrier 120 and chip portions disposed on the respective chips 112.1, 112.2 etc. For example, a carrier portion is shown at 122.1c and a chip portion at 122.1chip.

The terminology above, stating that "the communications ring has . . . chip portions disposed on the respective chips"

[emphasis added] should be understood to include, for example, the communications ring 122 having a portion, such as chip portion 122.1chip, traversing at least a portion of one of the chips, e.g., 112.1, either embedded in the chip or on an outside surface of the chip. Likewise for the terminology regarding the carrier.

FIG. 1 particularly shows that the chip ring portions of the ring 122 include respective regeneration circuitry portions 117.1, 117.2, 117.3 and 117.4 interposed on the respective chip portions 112.1chip, 112.2chip, 112.3chip, and 112.4chip, wherein the respective signals thereon, during their traversals of the respective chips, pass through, i.e. are processed by, regeneration circuitry on the respective chips. Also, FIG. 1 particularly shows that the chips 112 have respective first and second i/o sets 114-1 and 114-2, and that the respective 122.1chip, 122.2chip, etc. portions of the ring 122 traverse from respective first i/o sets 114.1-1, 114.2-1, etc. to respective second i/o sets 114.1-2, 114.2-2, etc.

In one aspect, this arrangement permits the carrier ring portions to be substantially straight, whereas chip ring portions turn on the respective chips 112 in traversing from the first i/o set 114-1 to the second set 114-2 (to enable the closure of the ring). This is particularly beneficial, because fabrication techniques generally permit conductors on a chip to be spaced relatively more close together than conductors on a carrier.

In FIG. 1, the module has four integrated circuit chips 112. Four bus sets are shown, as will now be described. As previously stated, the four chips 112 have respective first i/o sets 114.1-1, 114.2-1,etc. and second i/o sets 114.1-2, 114.2-2, etc. The first i/o set 114.1-1$a$, 114.1-1$b$, 114.1-1$c$ and 114.1-1$d$ of the first chip 112.1 is electrically coupled, by a first one of the bus sets 122.1$a$, 122.1$b$, 122.1$c$ and 122.1$d$, to a corresponding i/o set, i.e., the second i/o set 114.2-2$a$, 114.2-2$b$, 114.2-2$c$ and 114.2-2$c$, of the second chip 112.2. The other i/o set 114.2-1$a$, 114.2-1$b$, 114.2-1$c$ and 114.2-1$d$ of the second chip 112.2 is electrically coupled, by the second bus set 122.2$a$, 122.2$b$, 122.2$c$ and 122.2$d$ to the i/o set 114.3-2$a$, 114.3-2$b$, 114.3-2$c$ and 114.3-2$d$ of the third chip 112.3, and so on through the fourth chip 112.4. In addition, the first i/o set 114.1-1$a$, 114.1-1$b$, 114.1-1$c$ and 114.1-1$d$ of the fourth chip 112.4 is electrically coupled, by the fourth bus set 122.4$a$, 122.4$b$, 122.4$c$ and 122.4$d$ to the second i/o set 114.1-2$a$, 114.1-2$b$, 114.1-2$c$ and 114.1-2$d$ of the first chip 112.1, thereby closing the ring 122. Thus, the chips 112 are electrically coupled for communicating in a ring 122.

Furthermore, according to this embodiment as shown in FIG. 1, the corresponding i/o sets 114.1-1 and 114.2-2 of the first and second chips, 112.1 and 112.2 respectively, are in substantial alignment; the corresponding i/o sets 114.2-1 and 114.3-2 of the second and third chips, 112.2 and 112.3 respectively, are in substantial alignment; the corresponding i/o sets 114.3-1 and 114.4-2 of the third and fourth chips, 112.3 and 112.4 respectively, are in substantial alignment; and the corresponding i/o sets 114.4-1 and 114.1-2 of the fourth and first chips, 112.4 and 112.1 respectively, are in substantial alignment.

This alignment of the corresponding i/o sets advantageously facilitates the previously mentioned, substantially straight module portions of the ring. That is carrier buses 122.1, 122.2, 122.3 and 122.4 on the carrier are substantially straight and electrically couple the respective corresponding i/o sets (114.1-1,114.2-2), (114.2-1,114.3-2), (114.3-1,114.4-2) and (114.4-1,114.1-2).

In another aspect of FIG. 1, the chips 112 have their respective first i/o sets 114-1 located symmetrically with respect to their respective second i/o sets 114-2. In still another aspect, the physical symmetry of the i/o sets 114-1 and 114-2 is a rejection symmetry.

These two aspects both concern advantageously enabling the placement of a number of chips, each having substantially identical i/o layouts, on a carrier in a manner whereby by merely having a rotated orientation of the chips with respect to one another, the chips may be interconnected by substantially straight conductors on the carrier.

In yet another aspect of FIG. 1, the symmetry, for such first and second i/o sets 114-1 and 114-2 on a chip 112, is a reflection symmetry with respect to a diagonal 130 between two corners 132$a$ and 132$b$ of the chip. Furthermore, according to another aspect, the first i/o sets 114-1 are associated with a first edge 134-1 of their respective chips and the second i/o sets 114-2 are associated with a second edge 134-2 of their respective chips 112. In a still further aspect of FIG. 1, where there are four chips 112, the second edge 134-2 is a side adjacent to the first edge 134-1, and the adjacent first and second edges have a common endpoint at the corner 132$a$ of the chip. This corner is the corner common to the first and second edges, i.e., the common endpoint corner. Also, the four chips are substantially co-planar, wherein within the substantially shared plane in which the chips are substantially co-planar, the second chip 112.2 is rotated 90 degrees relative to the first chip 112.1, the third chip 112.3 is rotated 90 degrees relative to the second chip 112.2, and the fourth chip 112.4 is rotated 90 degrees relative to the third chip 112.3.

Note that each chip 112 is connected to two carrier portions of the communication ring. For example, chip 112.1 is connected to carrier ring portions 122.1 and 122.4. Two such carrier ring portions may alternatively be referred to as two carrier bus sets. According to this terminology, each chip is coupled to respective first and second carrier bus sets interconnecting the N chips in a ring. It is noteable that each bus 122.1$a$, 122.1$b$, 122.1$c$ and 122.1$d$; 122.2$a$, 122.2$b$, 122.2$c$ and 122.2$d$; etc. in the respective carrier bus sets 122.1, 122.2, etc. provides a one-way communications path. The direction of communication is indicated by arrows besides the respective buses. As compared to two-way communication, the one-way communication aspect of the present invention advantageously speeds communication by eliminating dead time on the bus that is required when changing the direction of communication on a two-way communication bus.

Figure 2:
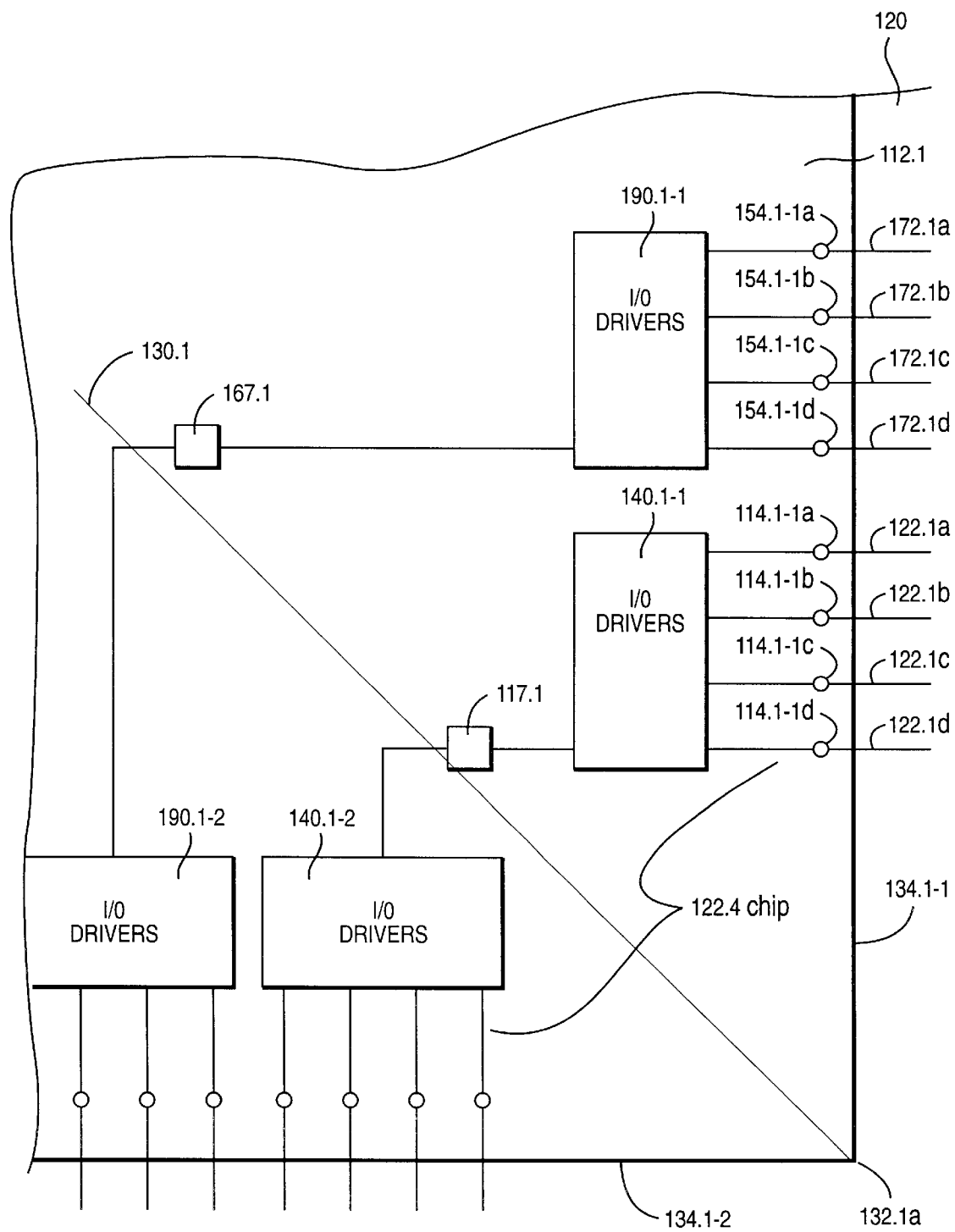
FIG. 2 illustrates further details not shown in FIG. 1.

FIG. 2 illustrates additional details for the multi-chip module of FIG. 1. Chip 112.1 is shown on the module carrier 120. This detail shows that the i/o sets 114.1-1 and 114.1-2 are connected to respective i/o drivers 140.1-1 and 140.1-2 on the chip 112.1. Thus, for chip 112.1 the chip portion 122.1chip of the communication ring 122 includes the i/o sets 114.1-1 and 114.1-2, the i/o drivers 140.1-1 and 140.1-2, the regeneration circuitry 117.1, and the interconnecting wiring shown on the chip 112.1.

The structure illustrated in FIG. 1 lends itself to a method for inter-chip communication, as illustrated in the flow charts of FIGS. 3 through 8. In the following example, chip 112.1 will be a sending chip, and chip 112.3 will be a receiving chip. According to this method, a sending one of the N chips, chip 112.1 in this example, transmits a signal to a receiving one of the N chips, chip 112.3 in this example, from the sending chip's first bus set 122.1 or second bus set 122.2. The clockwise direction corresponds to i/o set 114.1-1 for chip 112.1. The counter-clockwise direction corresponds to i/o set 114.1-2 for chip 112.1. The direction around the ring depends on i) the number of intervening chips disposed between the receiving chip and the sending chip in the first direction around the ring, and ii) the number of intervening chips disposed in the ring between the receiving chip and the sending chip in the second direction around the ring. In the illustrated case, there is one intervening chip, chip 112.2, in the clockwise direction and one intervening chip, again chip 112.2, in the counter-clockwise direction. The transmission is in the clockwise direction, in this example, because in this embodiment each of the chips has only one i/o set connected to a path for a receiving chip having an intervening chip between the sending and receiving chip, and that i/o set is the one for the clockwise direction around the ring 122.

The sending chip, chip 112.1 in this example, transmits the signal to the receiving chip via i/o sub-set 114.1-1c, from among the sub-sets 114.1-1a, 114.1-1b and 114.1-1c in the selected i/o set 114.1-1.

The following table, TABLE 1, sets out a pattern of i/o sets, which are coupled to corresponding bus sets, for the embodiment illustrated in FIG. 1.

TABLE 1

| Direction | # intrvng Chips | i/o set | i/o sub-set |
|---|---|---|---|
| Clockwise | 0 | 1 | a |
| Clockwise | 1 | 1 | c |
| Cntr-clkws | 0 | 2 | b |

According to this embodiment, the one of the i/o sets, and its corresponding bus set, via which the signal is transmitted depends on the number of intervening chips disposed in the ring between the receiving chip and the sending chip in the selected direction around the ring. In the illustrated case, the transmission is via i/o subset 114.1-1c because there is one intervening chip, chip 112.2, between the sending chip, chip 112.1, and the receiving chip, 112.3, in the selected direction, clockwise, and according to the predetermined structure the "c" bus connects chips in the clockwise direction which have 1 intervening chip.

The sending chip's i/o driver circuitry 140.1 drives the signal onto the selected bus 122.1c toward the receiving chip 112.3.

In another aspect, the signal is transmitted on the bus 122.1c, which includes the signal traversing the interposed (aka "intervening") chip 112.2 disposed in the ring between the receiving chip 112.3 and the sending chip 112.1. The signal traversing the intervening chip 112.2 includes the signal being regenerated by the intervening chip's regeneration circuitry 117.2.

In a second example, chip 112.1 is again the sending chip, and chip 112.4 is the receiving chip. According to the method, a sending one of the N chips, again chip 112.1 in this example, transmits a signal to a receiving one of the N chips, chip 112.4 in this second example, from the sending chip's first bus set 122.1 or second bus set 122.2. The direction again depends on i) the number of intervening chips disposed between the receiving chip and the sending chip in a first direction around the ring, and ii) the number of intervening chips disposed in the ring between the receiving chip and the sending chip in a second direction around the ring. In this second example, there are two intervening chips, chip 112.2 and chip 112.3, in the clockwise direction and no intervening chips in the counter-clockwise direction. The transmitting is in the counter-clockwise direction, because there are less intervening chips in that direction.

In the flowcharts of FIGS. 3 through 8, a number of method embodiments are illustrated. Although these flowcharts appear to indicate steps in a sequential fashion, and while the steps may be in the sequence shown, it is not necessary that all the steps be in the sequence indicated, as will be understandable from the context.

Figure 3:
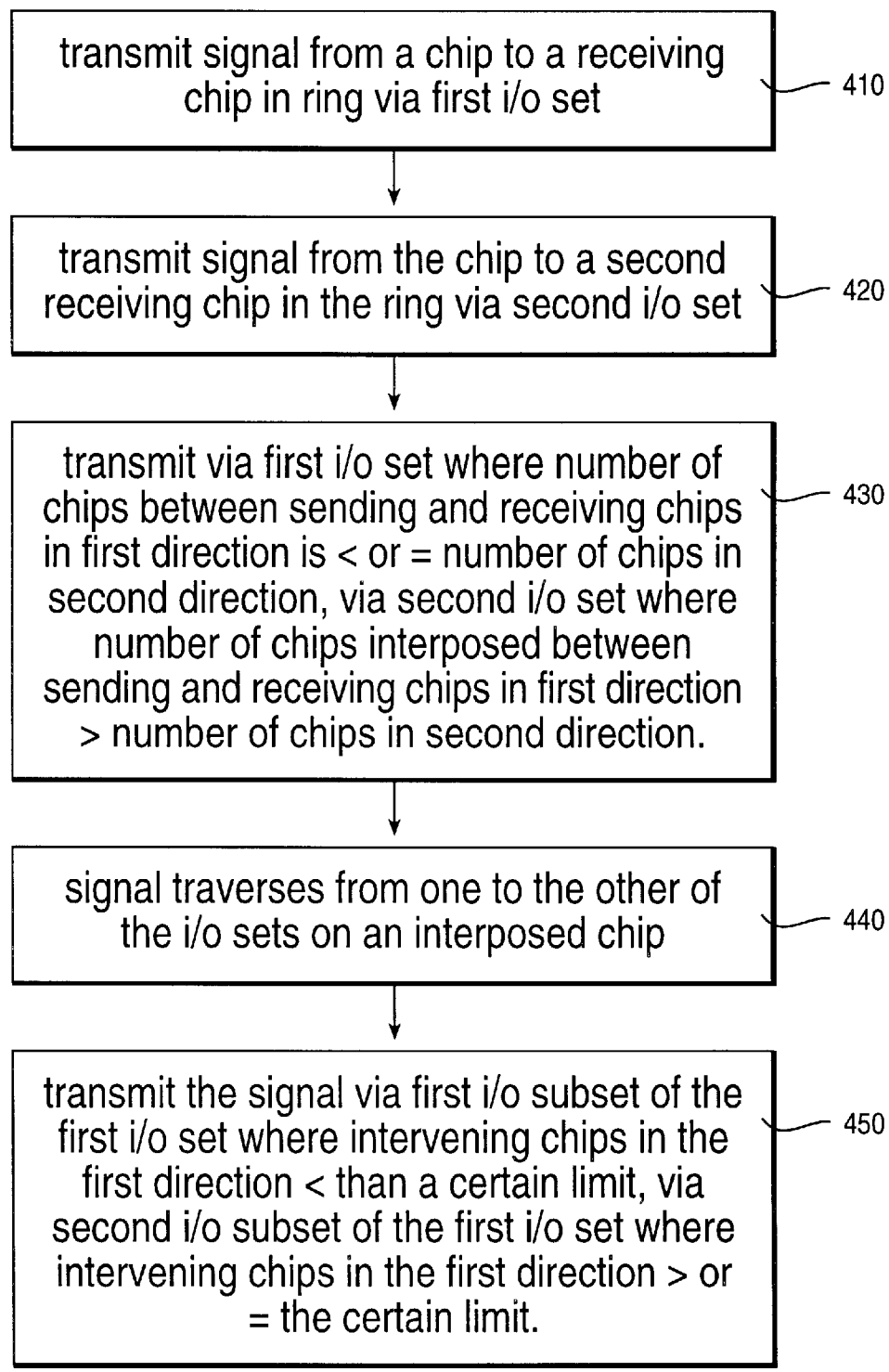
FIGS. 3 through 8 are flow charts for various methods of communicating among chips, such as the chips in the multi-chip module of FIG. 1.

Referring first to FIG. 3, in a first step at 410, a signal is transmitted from a chip, such as chip 112.1, to a receiving chip, such as chip 112.3, in the ring 122 via the sending chip's first i/o set 114-1. At step 420, a signal is also transmitted from the sending chip to a second receiving chip, such as chip 112.4, in the ring via the sending chip's second i/o set 114-2. At step 430, one of the signals, i.e., a signal such as the signal in step 410, is transmit via first i/o set where the number of chips between the sending and receiving chips in the first, clockwise, direction of the first i/o set for the sending chip is not greater than the number of chips in second, counter-clockwise, direction. Also, one such signal, i.e., a signal such as the signal in step 420, is transmitted via the second i/o set, where the number of chips interposed between the sending and receiving chips in the first, i.e. clockwise, direction is greater than the number of chips in the second, counter-clockwise direction. In step 440, one such signal, e.g., a signal such as the the signal in step 410, traverses from one to the other of the i/o sets on an interposed chip, i.e., chip 112.2. In step 450, a signal is transmitted via a first i/o subset, i.e. i/o subset 114.1-1a, of the first i/o set, where intervening chips in the first direction are less than one, and a signal such as the one in step 420 is transmitted via second i/o subset, i.e., subset 114.1-1c, of the first i/o set where intervening chips in the first direction are greater than or equal to 1.

Figure 4:
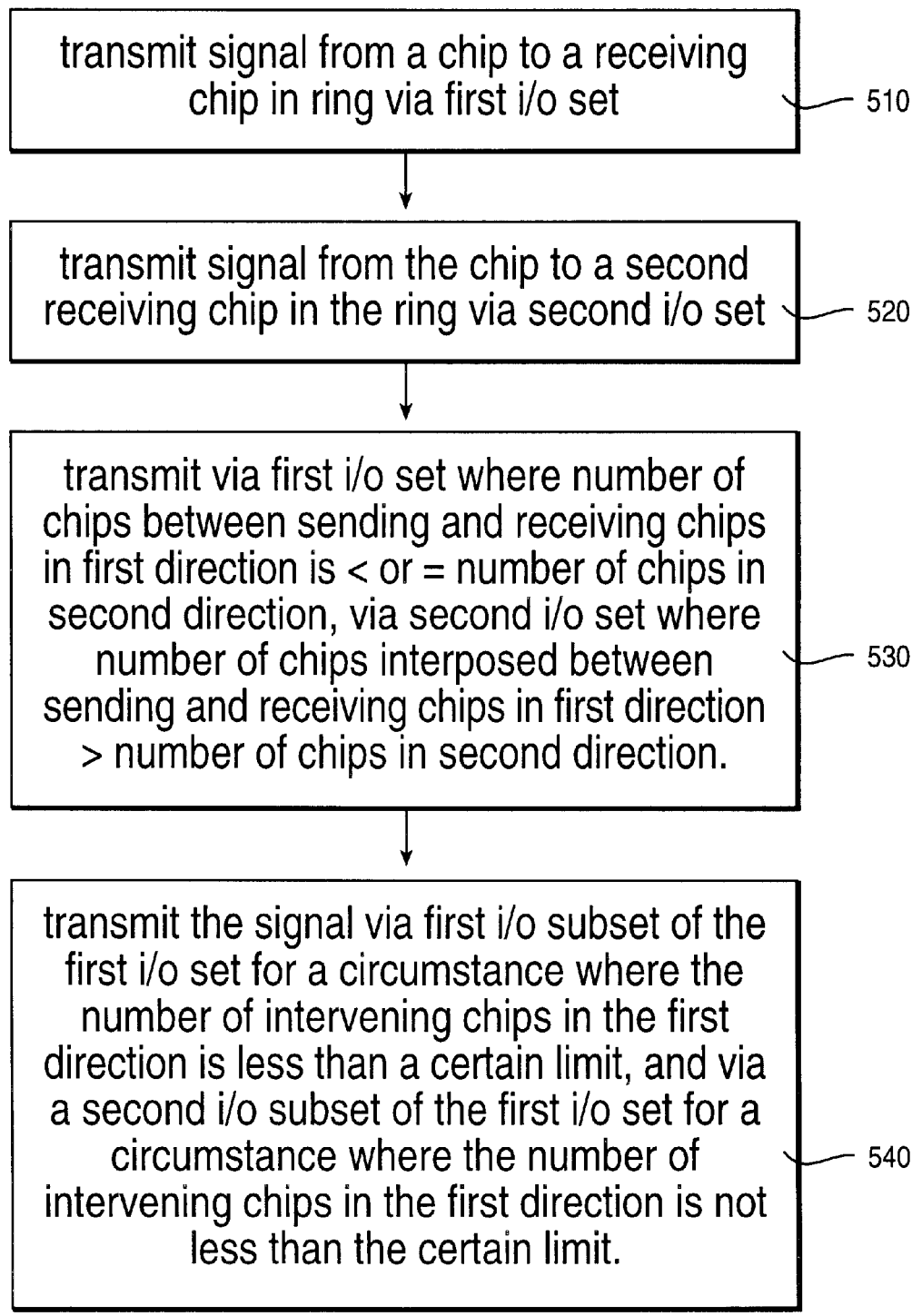

Referring now to FIG. 4, in another embodiment, a signal is transmitted in a first step at 510, a signal is transmitted from a chip, such as chip 112.1, to a receiving chip, such as chip 112.3, in the ring 122 via the sending chip's first i/o set 114-1. At step 520, a signal is also transmitted from the sending chip to a second receiving chip, such as chip 112.4, in the ring via the sending chip's second i/o set 114-2. At step 530, one of the signals, i.e., a signal such as the signal in step 510, is transmit via first i/o set where the number of chips between the sending and receiving chips in the first, clockwise, direction of the first i/o set for the sending chip is not greater than the number of chips in second, counter-clockwise, direction. Also, one such signal, i.e., a signal such as the signal in step 520, is transmitted via the second i/o set, where the number of chips interposed between the sending and receiving chips in the first, i.e. clockwise, direction is greater than the number of chips in the second, counter-clockwise direction. In step 540, a signal is transmitted via a first i/o subset, i.e. i/o subset 114.1-1a, of the first i/o set, where intervening chips in the first direction are less than one, and a signal such as the one in step 420 is transmitted via second i/o subset, i.e., subset 114.1-1c, of the first i/o set where intervening chips in the first direction are greater than or equal to 1.

Figure 5:
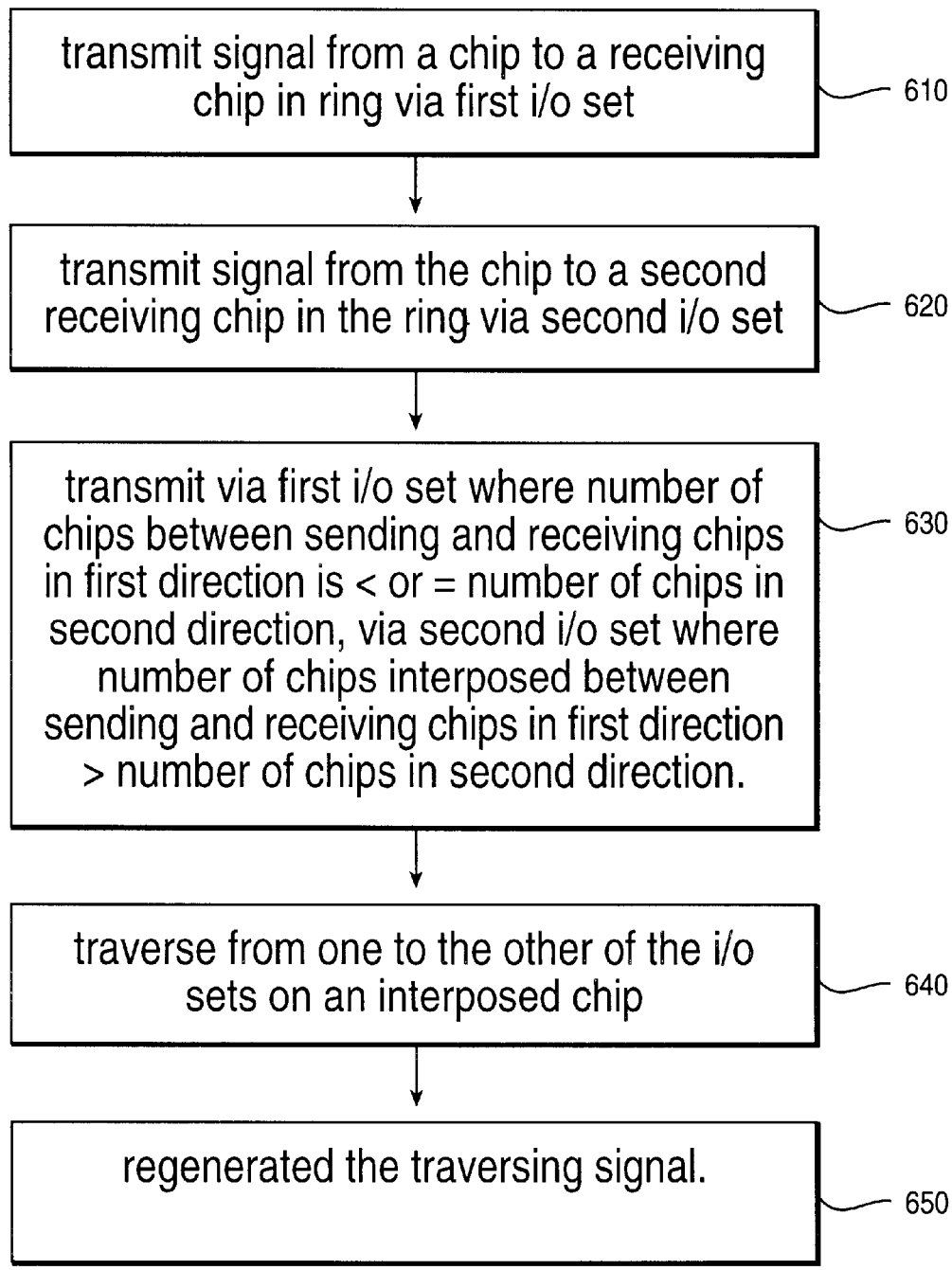

Referring now to FIG. 5, in another embodiment, in a first step at 610, a signal is transmitted from a chip, such as chip 112.1, to a receiving chip, such as chip 112.3, in the ring 122 via the sending chip's first i/o set 114-1. At step 620, a signal is also transmitted from the sending chip to a second receiving chip, such as chip 112.4, in the ring via the sending chip's second i/o set 114-2. At step 630, one of the signals, i.e., a signal such as the signal in step 610, is transmit via first i/o set where the number of chips between the sending and receiving chips in the first, clockwise, direction of the first i/o set for the sending chip is not greater than the number of chips in second, counter-clockwise, direction. Also, one such signal, i.e., a signal such as the signal in step 620, is transmitted via the second i/o set, where the number of chips interposed between the sending and receiving chips in the first, i.e. clockwise, direction is greater than the number of chips in the second, counter-clockwise direction. In step 640, one such signal, e.g., a signal such as the the signal in step 410, traverses from one to the other of the i/o sets on an interposed chip, i.e., chip 112.2. In step 650 the traversing signal is regenerated on the interposing chip.

Figure 6:
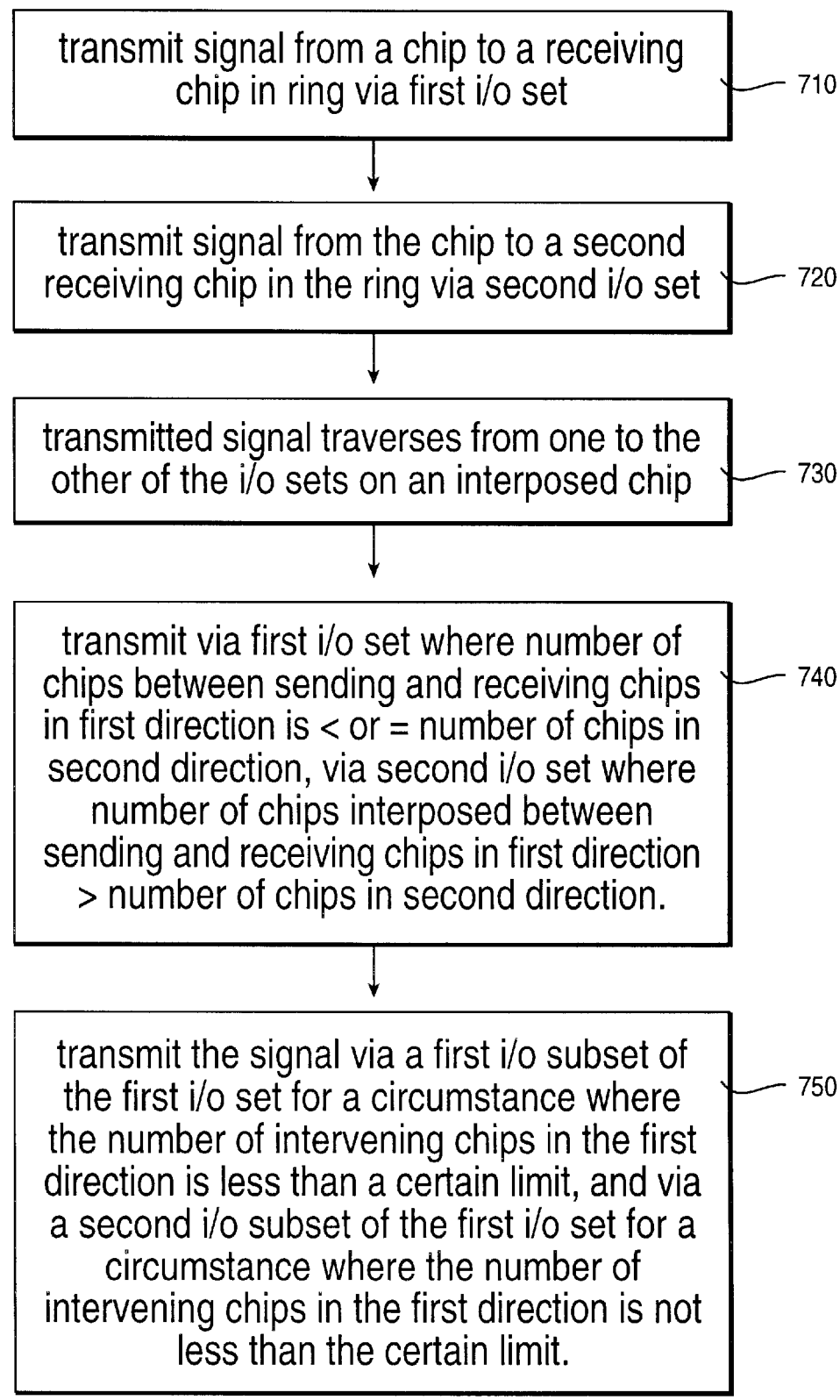

Referring now to FIG. 6, in another embodiment, in a first step at 710, a signal is transmitted from a chip, such as chip 112.1, to a receiving chip, such as chip 112.3, in the ring 122 via the sending chip's first i/o set 114-1. At step 720, a signal is also transmitted from the sending chip to a second receiving chip, such as chip 112.4, in the ring via the sending chip's second i/o set 114-2. In step 730, one such signal, e.g., a signal such as the the signal in step 410, traverses from one to the other of the i/o sets on an interposed chip, i.e., chip 112.2. At step 740, one of the signals, i.e., a signal such as the signal in step 710, is transmitted via first i/o set where the number of chips between the sending and receiving chips in the first, clockwise, direction of the first i/o set for the sending chip is not greater than the number of chips in second, counter-clockwise, direction. Also, one such signal, i.e., a signal such as the signal in step 720, is transmitted via the second i/o set, where the number of chips interposed between the sending and receiving chips in the first, i.e. clockwise, direction is greater than the number of chips in the second, counter-clockwise direction. In step 750, a signal is transmitted via a first i/o subset, i.e. i/o subset 114.1-1a, of the first i/o set, where intervening chips in the first direction are less than one, and a signal such as the one in step 720 is transmitted via second i/o subset, i.e., subset 114.1-1c, of the first i/o set where intervening chips in the first direction are greater than or equal to 1.

Figure 7:
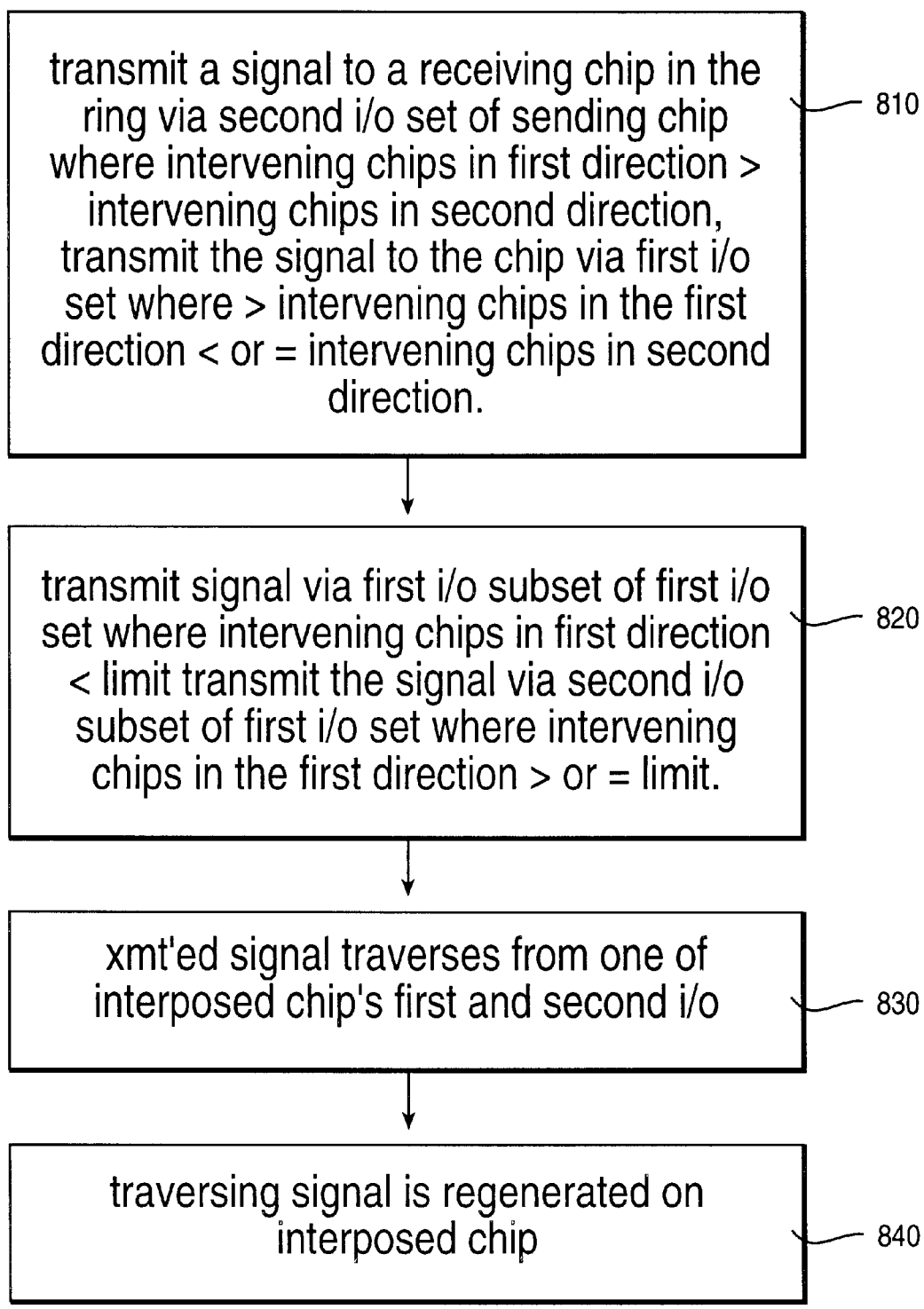

Referring now to FIG. 7, in another embodiment, according to step 810 a signal is transmitted to a receiving chip in the ring via second i/o set of the sending chip where intervening chips in the first direction are greater in number than in the second direction. Alternatively, the signal is transmitted to the receiving chip via the first i/o set of the sending chip, where the number of intervening chips in the first direction is not greater than in the second direction. In step 820, one such signal, e.g., a signal such as a signal in step 810 transmitted via the first i/o set, traverses from one to the other of the i/o sets on an interposed chip, i.e., chip 112.2. In step 830, such a signal is transmitted via a first i/o subset, i.e. i/o subset 114.1-1a, of the first i/o set, where intervening chips in the first direction are less than one, and a signal such as the one in step 810 is transmitted via second i/o subset, i.e., subset 114.1-1c, of the first i/o set where intervening chips in the first direction are greater than or equal to one. In step 840, the traversing signal is regenerated on the interposed chip.

Figure 8:
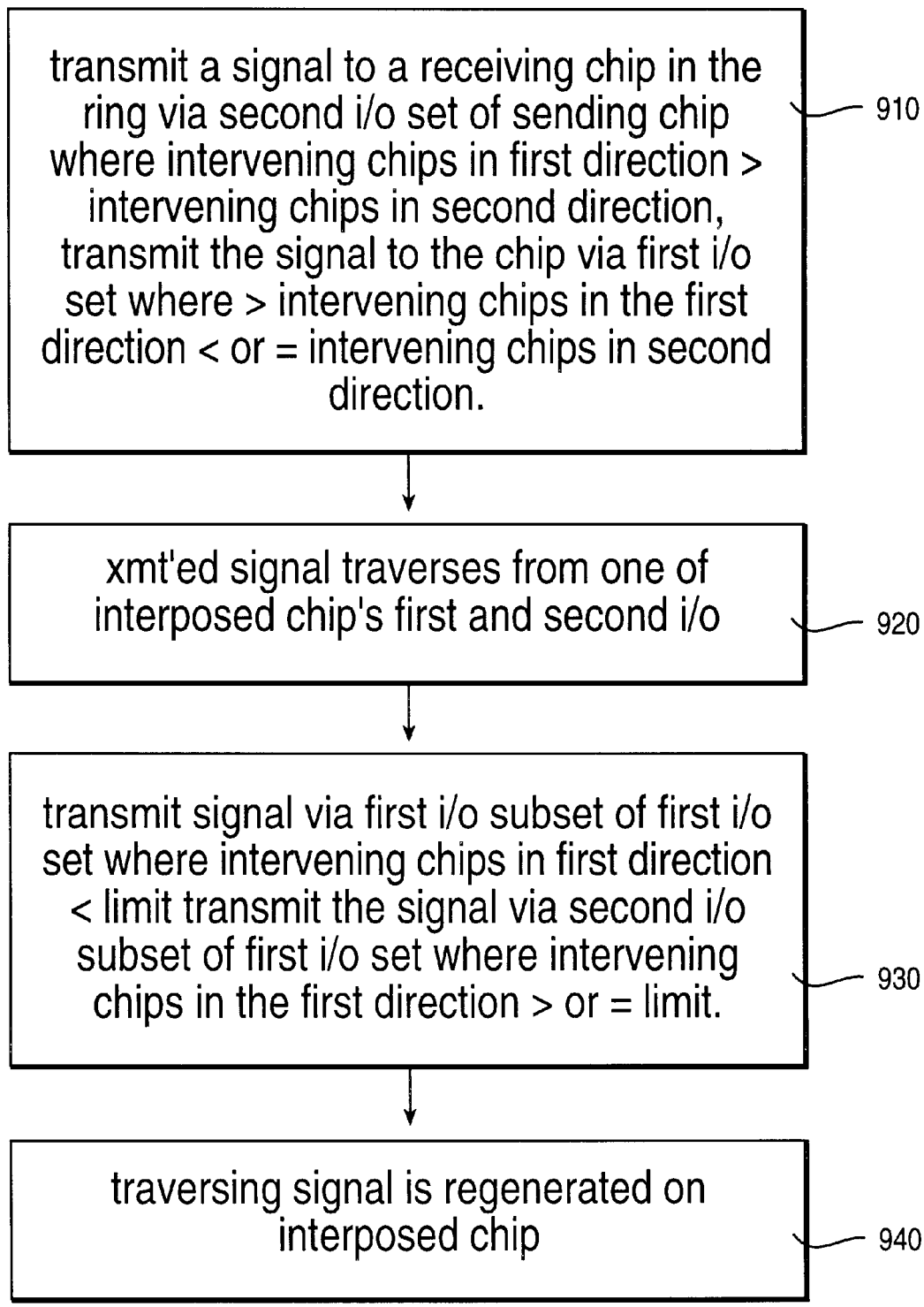

Referring now to FIG. 8, in another embodiment, according to step 910 a signal is transmitted to a receiving chip in the ring via second i/o set of the sending chip where intervening chips in the first direction are greater in number than in the second direction. Alternatively, the signal is transmitted to the receiving chip via the first i/o set of the sending chip, where the number of intervening chips in the first direction is not greater than in the second direction. In step 820, such a signal is transmitted via a first i/o subset, i.e. i/o subset 114.1-1a, of the first i/o set, where intervening chips in the first direction are less than one, and a signal such as the one in step 810 is transmitted via second i/o subset, i.e., subset 114.1-1c, of the first i/o set where intervening chips in the first direction are greater than or equal to one. In step 830, one such signal, e.g., a signal such as a signal in step 810 transmitted via the first i/o set, traverses from one to the other of the i/o sets on an interposed chip, i.e., chip 112.2. In step 840, the traversing signal is regenerated on the interposed chip.

Although the present invention and its advantages have been described in detail, it should be understood that various changes, substitutions and alterations can be made herein without departing from the spirit and scope of the invention as defined by the appended claims.

What is claimed is:

1. An integrated circuit chip having a first i/o set associated with a first edge of a chip and a second i/o set associated with a second edge of the chip, wherein with other such chips disposed on a carrier, a physical arrangement of the first and second i/o sets is such that the first i/o set of the chip is capable of being aligned with the second i/o set of a first one of the other chips, and the second i/o set of the chip is capable of being aligned with the first i/o set of a second one of the other chips, so that the chip is capable of being electrically interconnected to the first and second other such chips by substantially straight buses disposed on the carrier;

wherein the chip has a bus disposed on the chip and the first and second i/o sets each have a respective first i/o subset coupled to the chip-disposed bus and for coupling to a respective one of the carrier-disposed buses so that signals between the first and second ones of the other chips may traverse the chip.

2. The chip of claim 1, wherein the physical arrangement has a reflection symmetry between the first and second i/o sets.

3. The chip of claim 2, wherein the reflection symmetry is with respect to a diagonal between two corners of the chip.

4. The chip of claim 1, wherein the second edge is a side adjacent to the first edge.

5. The chip of claim 4, wherein the symmetry is a reflection symmetry.

6. The chip of claim 5, wherein the reflection symmetry is with respect to a diagonal between two corners of the chip.

7. The chip of claim 6, wherein said adjacent first and second edges have a common endpoint at a corner of the chip, and wherein one of said two corners is the common endpoint corner.

8. The chip of claim 1, wherein the chip-disposed bus has regeneration circuitry for regenerating said signals traversing the chip.

9. The chip of claim 1, wherein the chip-disposed bus has a turn, to facilitate the carrier-disposed buses being substantially straight.

10. The chip of claim 1, wherein the first and second i/o sets have second and third i/o subsets, and for the first i/o set:
the second i/o subset is for communication between the chip and the first one of the other chips, and
the third i/o subset is for communication between the chip and a third one of the other chips, and for the second i/o set:
the second i/o subset is for communication between the chip and the second one of the other chips, and
the third i/o subset is for communication between the chip and the third one of the other chips.

* * * * *